United States Patent [19]
Maeda et al.

[11] Patent Number: 5,610,565
[45] Date of Patent: Mar. 11, 1997

[54] COMPOSITE LC DEVICE WITH A GROUND ELECTRODE NOT FORMED ON THE INDUCTOR PARTS

[75] Inventors: Eiichi Maeda; Katsuhisa Imada; Motoi Nishii; Yoshihiro Nishinaga, all of Nagaokakyo, Japan

[73] Assignee: Murata Manufacturing Co., Ltd., Japan

[21] Appl. No.: 382,577

[22] Filed: Feb. 2, 1995

[30] Foreign Application Priority Data

Feb. 2, 1994 [JP] Japan .................................. 6-11141
May 12, 1994 [JP] Japan .................................. 6-98764

[51] Int. Cl.⁶ .................................................. H03H 7/04
[52] U.S. Cl. ........................................ 333/185; 333/181
[58] Field of Search ............................. 333/185, 219, 333/181, 182, 183, 184

[56] References Cited

U.S. PATENT DOCUMENTS 4,573,101  2/1986  Takeno ................................ 333/185 X
5,225,969  7/1993  Takaya et al. ..................... 333/185 X Primary Examiner—Benny T. Lee
Assistant Examiner—Justin P. Bettendorf
Attorney, Agent, or Firm—Ostrolenk, Faber, Gerb & Soffen, LLP

[57] ABSTRACT

A composite electronic component includes a sintered body, an inductor part and a capacitor part which are formed in the sintered body, and a ground electrode which is formed on an outer surface of the sintered body to be electrically connected to a first capacitor electrode of the capacitor part and not to reach an outer surface of the inductor part on the outer surface of the sintered body.

8 Claims, 11 Drawing Sheets

COMPOSITE LC DEVICE WITH A GROUND ELECTRODE NOT FORMED ON THE INDUCTOR PARTS

BACKGROUND OF THE INVENTION

1. Field of the Invention

The present invention relates to a composite electronic component comprising a sintered body which is provided therein with an inductor part and a capacitor part, and more particularly, it relates to a composite electronic component for surface mounting.

2. Description of the Background Art

A conventional composite electronic component 1 forming a T filter circuit is described with reference to FIGS. 12 to 14.

Referring to FIG. 12, the composite electronic component 1 is formed by a sintered body having a hexahedral shape. This sintered body is provided with inductor parts 2a and 2b and a capacitor part 3 which is arranged between the inductor parts 2a and 2b. On the other hand, a connection electrode 4 is formed on an upper surface of the sintered body. This connection electrode 4 electrically connects first ends of respective inductor electrodes of the two inductor parts 2a and 2b with a capacitor electrode which is connected to one portion of the capacitor part 3. Further, a ground electrode 5 is formed on a lower surface of the sintered body. This ground electrode 5 is electrically connected to a capacitor electrode which is connected to another portion of the capacitor part 3. First and second signal line electrodes 6a and 6b are formed on both end surfaces of the sintered body. The first and second signal line electrodes 6a and 6b are electrically connected to second ends of the inductor electrodes of the inductor parts 2a and 2b respectively.

FIG. 13 is an exploded perspective view showing the aforementioned composite electronic component 1 in a state before the sintered body is formed. In the composite electronic component 1, the inductor parts 2a and 2b which are formed by inductor green sheets 7a to 7f and 7g to 7l respectively and the capacitor part 3 which is formed by capacitor green sheets 8a to 8f are integrally connected with each other.

The inductor green sheets 7a to 7f are obtained through the following steps: A composition raw material containing a magnetic material of ferrite or the like is blended and mixed with an additive, and calcined. The calcined body obtained is wet-blended by a ball mill or the like, and crushed. The crushed material as obtained is further mixed with a binder or the like, to prepare a slurry. The slurry obtained is molded by a doctor blade coater or a sheet pull method to obtain a green sheet, which in turn is cut into prescribed dimensions.

As clearly understood from FIG. 13, inductor electrodes 10 and connection electrodes 11a and 11b for connecting the inductor electrodes 10 with the exterior are formed on the inductor green sheets 7b, 7j, 7d and 7h respectively. Through holes (not shown) are formed in first ends of the inductor electrodes 10, while second ends of the inductor electrodes 10 are connected to the connection electrodes 11a and 11b respectively. The connection electrodes 11a and 11b are formed to reach edges of the green sheets 7b, 7j, 7d and 7h respectively. Further, additional inductor electrodes 10 are formed on the inductor green sheets 7c and 7i respectively, and through holes (not shown) are formed in first ends of the inductor electrodes 10. The plurality of inductor electrodes 10 are electrically connected with each other via these through holes, to form the inductor part 2a with the inductor green sheets 7a to 7f. Similarly, the plurality of inductor electrodes 10 which are connected with each other via the through holes form the inductor part 2b with the inductor green sheets 7g to 7l.

The capacitor green sheets 8a to 8f are obtained through the following steps: A desired composition raw material containing dielectric ceramics having a high dielectric constant is blended and mixed with an additive, and thereafter calcined. The calcined body obtained is wet-blended by a ball mill or the like, and crushed. The crushed material obtained is mixed with a binder or the like, to prepare a slurry. The slurry obtained is sheet-formed by a doctor blade coater or a sheet pull method, and the sheet obtained is cut into desired dimensions to obtain the capacitor green sheets 8a to 8f.

Capacitor electrodes 12a to 12c are formed on the capacitor green sheets 8b to 8d respectively. The capacitor electrodes 12a to 12c are opposed to each other through the capacitor green sheets 8c and 8d respectively, and alternately extend out onto both end surfaces of the capacitor green sheets 8b to 8d. Thus, a laminate of the capacitor green sheets 8a to 8f integrally forms the capacitor part 3.

Intermediate layers 9 are provided between the inductor green sheets 7f and 7g and the capacitor green sheets 8a and 8f respectively. The intermediate layers 9, which are adapted to improve the adhesion between the inductor parts 2a and 2b and the capacitor part 3 after firing, are formed by green sheets obtained by mixing the inductor part material and the capacitor part material with each other and molding the same.

The green sheets 7a to 7l, 8a to 8f and 9 shown in FIG. 13 are stacked with each other in the illustrated order, to obtain a laminate. Arrow X shows the stacking direction. This laminate is compression-bonded along the stacking direction X, and fired to obtain a sintered body. A plurality of electrodes are formed on outer surfaces of the sintered body as hereafter described, to obtain the composite electronic component 1.

Referring again to FIG. 12, the connection electrode 4 is formed on the upper surface of the sintered body, for electrically connecting the connection electrodes 11b of the inductor parts 2a and 2b with the capacitor electrodes 12a and 12c respectively. The ground electrode 5 is formed on the lower surface of the sintered body, to extend in parallel with the stacking direction X. This ground electrode 5 is electrically connected to the capacitor electrode 12b. The signal line electrodes 6a and 6b are formed on the end surfaces of the sintered body which are in parallel with the ground electrode 5, i.e., the end surfaces extending along outer surfaces of the inductor parts 2a and 2b and the capacitor part 3. These signal line electrodes 6a and 6b are electrically connected to the connection electrodes 11a of the inductor parts 2a and 2b respectively. Therefore, the ground electrode 5 which is parallel to the stacking direction X is so formed as to reach not only the lower surface of the capacitor part 3 but those of the inductor parts 2a and 2b.

FIG. 14 shows the circuit structure of the composite electronic component 1. As shown in FIG. 14, two inductor parts are connected in series with each other and an end of the capacitor part is connected to the junction between the two inductor parts, to form a T filter.

In the aforementioned composite electronic component 1, however, the ground electrode 5 is formed in parallel with the stacking direction X, so it reaches the lower surfaces of the inductor parts 2a and 2b. On the other hand, the inductor parts 2a and 2b are provided therein with the inductor electrodes 10. Thus, floating capacitances are developed across the ground electrode 5 and the inductor electrodes 10 to deteriorate the high-frequency response, or voltages are applied across the same to deteriorate insulation resistance.

SUMMARY OF THE INVENTION

An object of the present invention is to overcome the aforementioned disadvantages of the conventional composite electronic component, and to provide a composite electronic component for surface mounting having excellent characteristics and reliability as well as an excellent high-frequency response and high insulation resistance, which can greatly reduce any bad influence exerted by a floating capacitance across a ground electrode and an inductor electrode.

According to a wide aspect of the present invention, provided is a composite electronic component comprising a sintered body provided with an inductor part having an inductor electrode and a capacitor part, and a ground electrode which is formed on an outer surface of the sintered body to be electrically connected to the capacitor part. The ground electrode is formed on the outer surface of the sintered body not to reach an outer surface of the inductor part. In other words, the ground electrode is formed on a surface of the capacitor part, and does not the outer surface of the inductor part. Therefore, substantially no floating capacitance is developed across the inductor electrode provided in the inductor part and the ground electrode. It is also possible to increase insulation resistance between the inductor electrode and the ground electrode.

Thus, it is possible to provide a composite electronic component having an excellent high-frequency response and high insulation resistance, which is excellent in characteristics and reliability.

More specifically, the capacitor part of the inventive composite electronic component has first and second capacitor electrodes which are connected to first and second potentials respectively, so that the first capacitor electrode is connected to the ground electrode.

According to a certain specific aspect of the present invention, the inductor part has an inductor electrode, and the composite electronic component further comprises a first signal line electrode which is formed on an outer surface of the sintered body to be electrically connected to a first end portion of the inductor electrode and the second capacitor electrode, and a second signal line electrode which is formed on an outer surface of the sintered body to be electrically connected to a second end portion of the inductor electrode.

In the composite electronic component according to the present invention, further, the sintered body is preferably formed by an integrally fired multilayer sintered body having a plurality of sintered body layers, so that a miniature composite electronic component can be manufactured with high productivity through a method of manufacturing a ceramic multilayer electronic component.

According to another specific aspect of the present invention, the aforementioned sintered body is in the form of a hexahedron having three pairs of opposite surfaces, while the sintered body is provided therein with first and second inductor parts having inductor electrodes respectively, and a capacitor part which is connected with the first and second inductor parts, and the aforementioned first and second signal line electrodes are formed on a pair of opposite surfaces of the sintered body so that first end portions of the inductor electrodes of the first and second inductor parts are electrically connected to the first and second signal line electrodes respectively, second end portions thereof are electrically connected with each other, and the second capacitor electrode of the capacitor part is electrically connected to the second end portions of the inductor electrodes of the first and second inductor parts. In this case, the first and second signal line electrodes are formed on a pair of opposite surfaces which are positioned on both sides of a portion formed by the first and second inductor parts and the capacitor part.

Preferably, the ground electrode extends in a direction substantially perpendicular to the stacking direction of the sintered body. Namely, the ground electrode extends in the direction perpendicular to the stacking direction on an outer surface of the capacitor part in the portion provided with the capacitor part.

According to still another specific aspect of the present invention, the aforementioned sintered body is in the form of a hexahedron having three pairs of opposite surfaces, while the sintered body is provided therein with a plurality of inductor parts, having inductor electrodes respectively, and a plurality of capacitor parts, which are formed in different regions, and the composite electronic component further comprises a plurality of signal line electrodes which are formed on at least one surface of two pairs of opposite surfaces of the sintered body, so that first end portions of the inductor electrodes of the plurality of inductor parts are electrically connected to one of the signal line electrodes respectively and second capacitor electrodes of the plurality of capacitor parts are electrically connected to the one of the signal line electrode. According to a particular aspect of the present invention, the sintered body is in the form of a hexahedron having three pairs of opposite surfaces, and provided therein with a plurality of inductor parts and a plurality of capacitor parts being formed in different regions, the plurality of inductor parts having inductor electrodes respectively, the plurality of capacitor parts having first capacitor electrodes connected to first electric potential and second capacitor electrodes connected to second electric potential, the composite electronic component further comprising a plurality of signal line electrodes being formed on at least one surface of opposite surfaces of two pairs of the opposite surfaces of the sintered body, the each of first and second end portions of the inductor electrodes of the plurality of inductor parts being electrically connected to one of the signal line electrodes, the second capacitor electrodes of the plurality of capacitor parts being electrically connected to the one signal line electrodes, at least one of the first capacitor electrodes of the plurality of capacitor parts being electrically connected to a ground potential. Further, more particularly, the sintered body is in the form of a hexahedron having three pairs of opposite surfaces, and provided therein with two inductor parts and two capacitor parts being formed in different sections, the two inductor parts having an inductor electrode respectively, the composite electronic component further comprising first, second and third signal line electrodes being formed on at least one surface of opposite surfaces of the two pairs of opposite surfaces of the sintered body, the first end portions of each inductor electrode of the two inductor parts being electrically connected to the first and second signal line electrodes respectively, second end portion of each inductor electrode of the two inductor parts being electrically connected to the third signal line electrode, second capacitor electrodes of the two capacitor parts being connected to the first and third signal line electrodes respectively.

Also in these cases, the signal line electrodes are preferably formed on a pair of opposite surfaces perpendicular to the stacked face of the sintered body layers, whereby the ground electrode can be readily formed on the outer surface of the capacitor parts.

According to a further specific aspect of the present invention, the aforementioned sintered body is in the form of a hexahedron having three pairs of opposite surfaces, while the sintered body is provided therein with a first inductor part, having an inductor electrode, and first and second capacitor parts which are formed in different sections, and the composite electronic component further comprises first and second signal line electrodes which are formed on a pair of opposite surfaces of the sintered body, so that first and second end portions of the inductor electrode of the first inductor part are electrically connected to the first and second signal line electrodes respectively, second capacitor electrodes of the first and second capacitor parts are connected to the first and second signal line electrodes respectively, and first capacitor electrodes of the first and second capacitor parts are electrically connected to the aforementioned earth electrode. Also in this case, the first and second signal line electrodes are formed on a pair of opposite surfaces perpendicular to the stacked face of the sintered body layers.

According to a further specific aspect of the present invention, the aforementioned sintered body is in the form of a hexahedron having three pairs of opposite surfaces, while the sintered body is provided therein with an inductor part having an inductor electrode and the aforementioned capacitor part, and the composite electronic component further comprises first and second signal line electrodes which are formed on a pair of opposite surfaces of the sintered body respectively, so that the inductor part and the capacitor part are formed in different regions of the sintered body, first and second end portions of the inductor electrode of the inductor part are electrically connected to the first and second signal line electrodes respectively, and a second capacitor electrode of the capacitor part is electrically connected to either the first or second signal line electrode. Also in this case, the first and second signal electrodes are formed on a pair of opposite surfaces perpendicular to stacked face of the sintered body, whereby the ground electrode can be readily formed on the outer surface of the capacitor part.

In the composite electronic component according to the present invention, the ground electrode may be formed on the overall region of the outer surface of the sintered body in the portion provided with the capacitor part, while the same is preferably formed on a part of the outer surface of the sintered body in the portion provided with the capacitor part.

The first and second signal line electrodes are preferably formed by sputtering films which are easy to form and capable of forming electrodes having stable characteristics.

Each of the signal line electrodes is preferably prepared from one of Ag, a multilayer film consisting of an Ag layer and a monel layer, and a multilayer film consisting of an Ag layer, a monel layer and an Ni—Cr alloy layer.

The inventive composite electronic component, in which the aforementioned inductor and capacitor part are electrically connected with each other in the aforementioned manner, forms a desired LC circuit, whereby it is possible to form a filter such as a T filter or a π filter, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
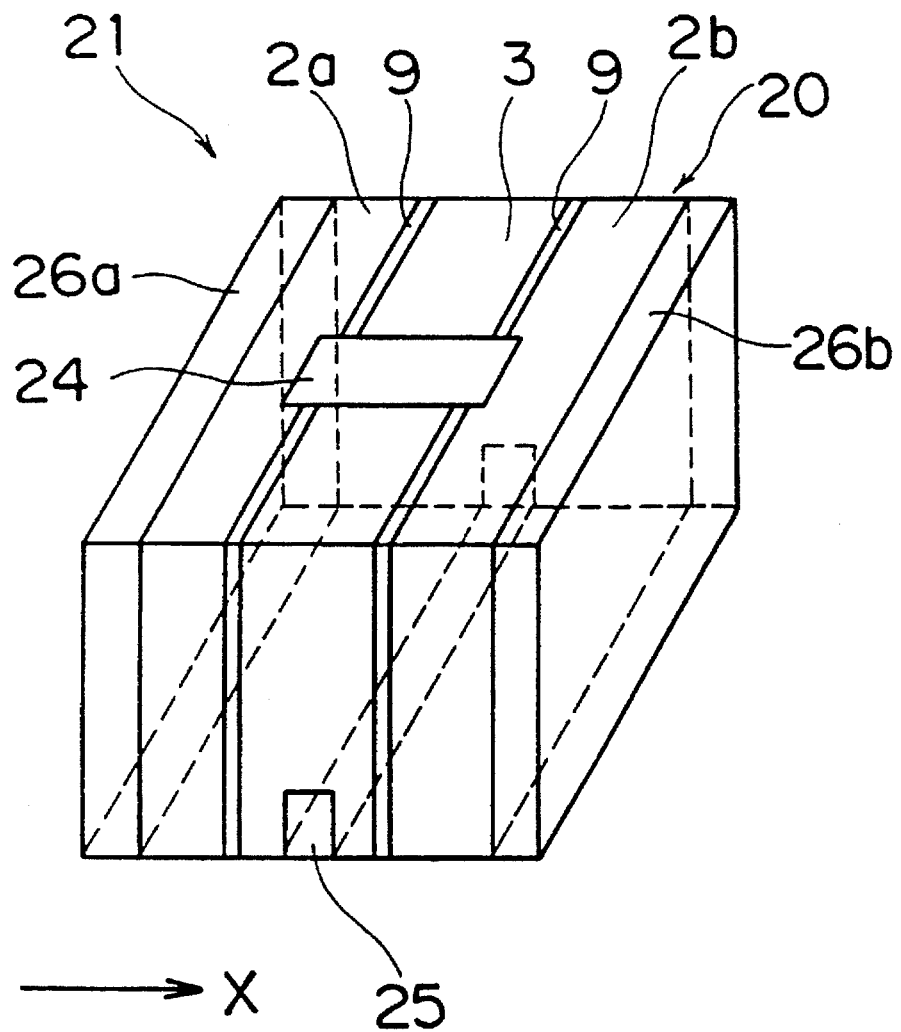
FIG. 1 is a perspective view showing a composite electronic component according to a first embodiment of the present invention.
Figure 2:
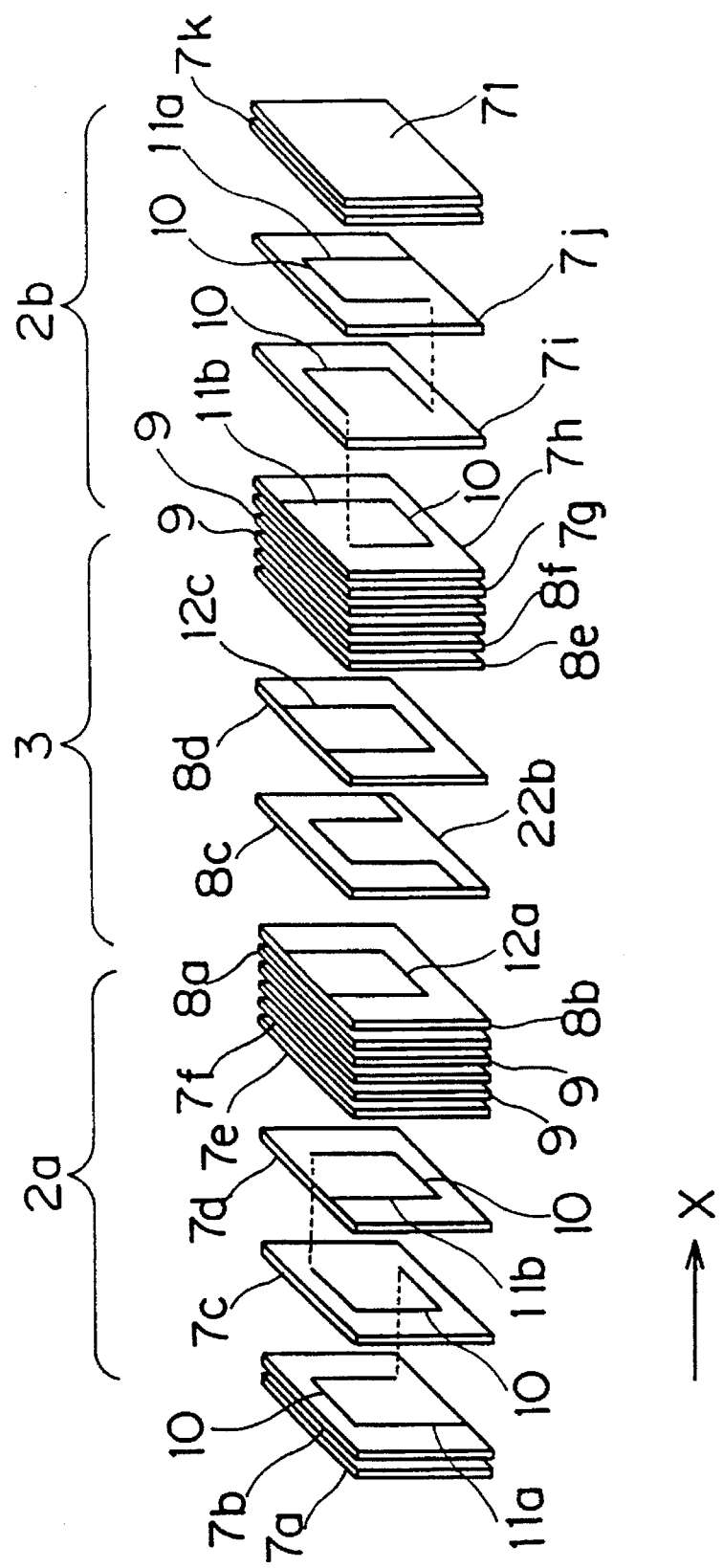
FIG. 2 is a preferable exploded perspective view of the composite electronic component shown in FIG. 1 in a state before firing.

With reference to FIGS. 1 and 2, a composite electronic component 21 forming a T filter according to a first embodiment of the present invention is now described.

FIG. 1 shows the appearance of the composite electronic component 21 forming a T filter. The composite electronic component 21 is formed by a sintered body 20 which is obtained by a method of manufacturing a ceramic electronic component described later. The sintered body 20 has a hexahedral shape. This sintered body 20 is provided therein with inductor parts 2a and 2b and a capacitor part 3 which is formed between the inductor parts 2a and 2b.

A connection electrode 24 is formed on an upper surface of the sintered body 20. This connection electrode 24 is electrically connected with first end portions of inductor electrodes of the two inductor parts 2a and 2b, and a second capacitor electrode of the capacitor part 3. A ground electrode 25 is formed on a lower surface of the sintered body 20. This ground electrode 25 is electrically connected to a first capacitor electrode 22b of the capacitor part 3. Further, signal line electrodes 26a and 26b are formed on both end surfaces of the sintered body 20. These signal line electrodes 26a and 26b are electrically connected to second end portions of the inductor electrodes of the inductor parts 2a and 2b respectively.

FIG. 2 is an exploded perspective view showing the sintered body 20 forming the aforementioned composite electronic component 21, in a state before firing. The structure shown in FIG. 2 is identical to that shown in FIG. 13, except that a capacitor green sheet 8g is employed in place of the capacitor green sheet 8c shown in FIG. 13. Therefore, portions identical to those shown in FIG. 13 are denoted by the same reference numerals, to omit redundant description.

The capacitor green sheet 8g is formed substantially similarly to the capacitor green sheet 8c, so that a capacitor electrode 22b has a substantially T-shaped form along the ground electrode 25, as shown in FIG. 2.

Figure 13:
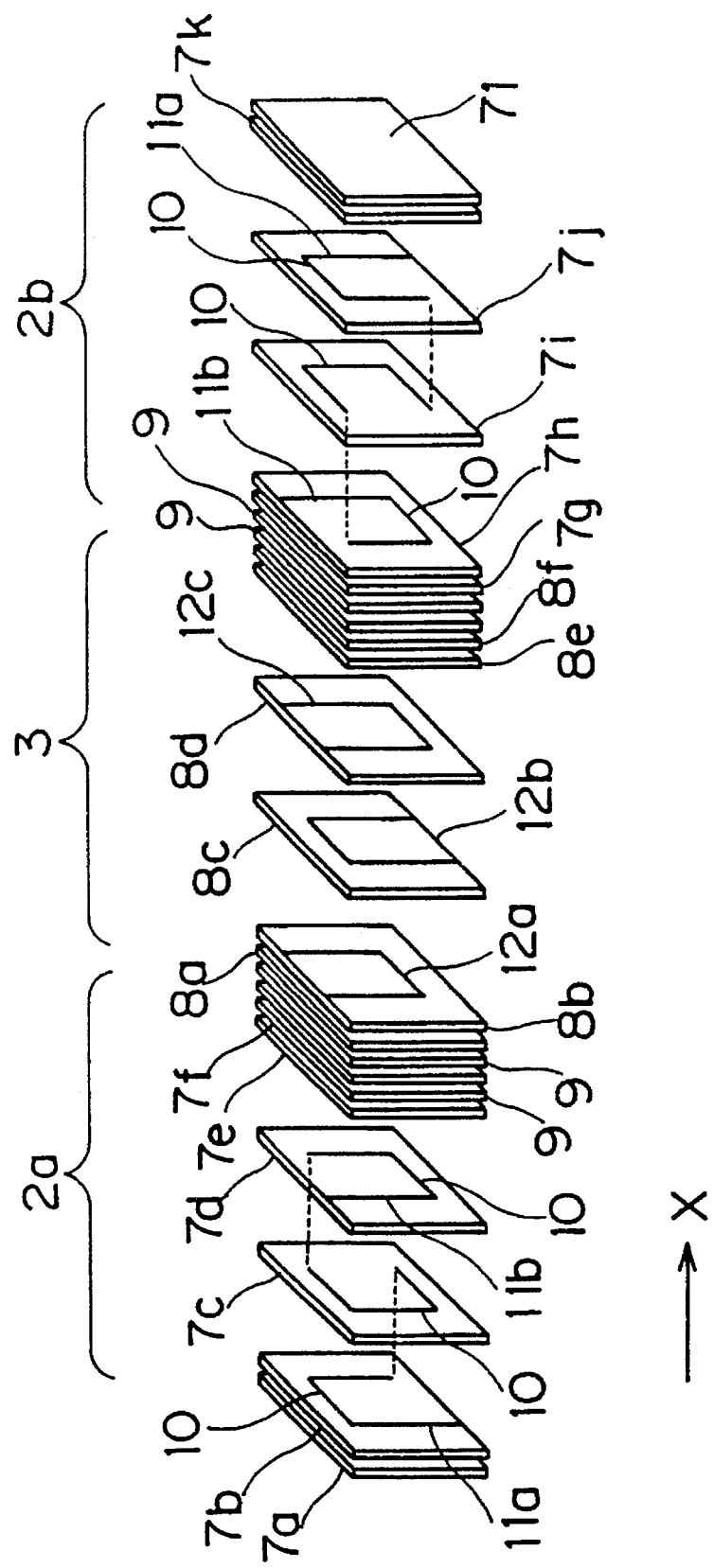
FIG. 13 is an exploded perspective view of the composite electronic component shown in FIG. 1 or 12 in a state before firing.

Similarly to the prior art shown in FIG. 13, green sheets 7a to 7l, green sheets 8a to 8g and a plurality of green sheets 9 for forming intermediate layers are stacked and compression-bonded along a stacking direction X, to obtain a laminate. The laminate as obtained is fired to obtain the sintered body 20 (see FIG. 1). The following electrodes are formed on outer surfaces of the sintered body 20, thereby obtaining the composite electronic component 21.

Referring again to FIG. 1, the connection electrode 24 is formed on the upper surface of the sintered body 20, so that connection electrodes 11a and 11b connected to inductor electrodes 10 are electrically connected with second capacitor electrodes 12a and 12c through the connection electrode 24. Further, the ground electrode 25 is formed on the lower surface of the sintered body 20 to extend perpendicularly to the stacking direction X, and electrically connected with a first capacitor electrode 12b. The first and second signal line electrodes 26a and 26b are formed on the end surfaces of the sintered body 20 which are parallel to the ground electrode 25, i.e., outer end surfaces of the inductor parts 2a and 2b, and electrically connected with the connection electrodes 11a which are connected to the inductor electrodes 10. In other words, the first and second signal line electrodes 26a and 26b are formed on a pair of opposite end surfaces of the sintered body 20 which are positioned on both sides of the stacking direction X. Thus, the ground electrode 25 extending perpendicularly to the stacking direction X is not formed on outer surfaces of the inductor part 2a and 2b.

Figure 14:
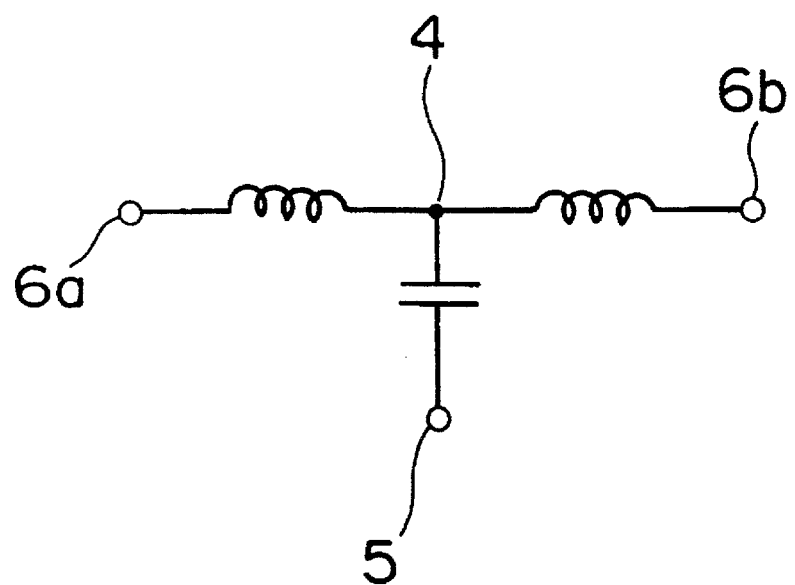
FIG. 14 is an equivalent circuit diagram of the composite electronic component shown in FIG. 1 or 12.

An equivalent circuit of the LC composite electronic component 21 according to the first embodiment of the present invention is in the form of a T filter with two inductor parts connected in series with each other and that an end of a capacitor part is connected to the junction, similarly to that shown in FIG. 14.

The capacitor green sheet 8g may be replaced by the capacitor green sheet 8c employed in the prior art.

A composite electronic component 31 forming an LC circuit according to a second embodiment of the present invention is now described with reference to FIGS. 3 and 4.

Figure 3:
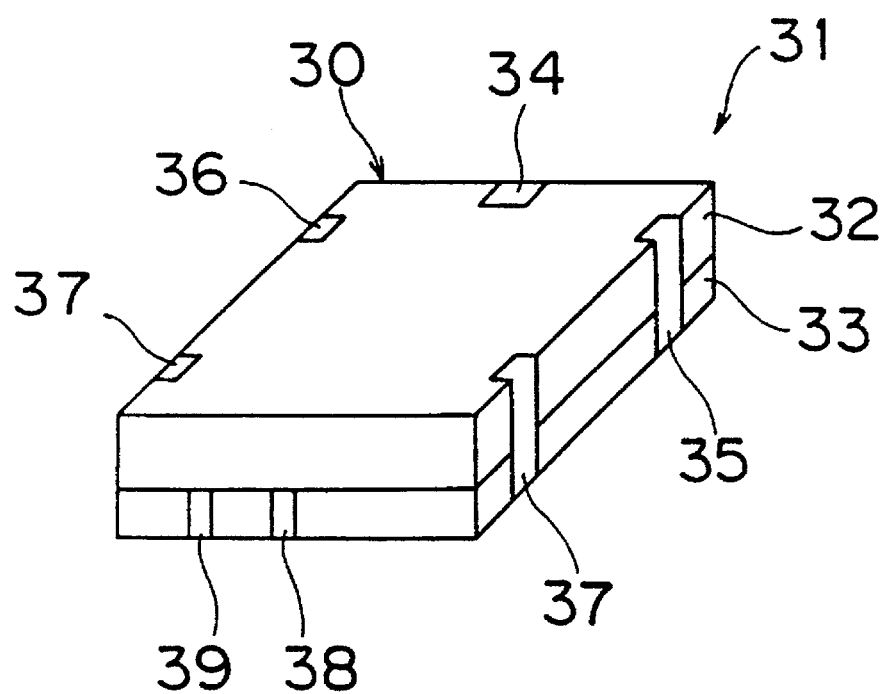
FIG. 3 is a perspective view showing a composite electronic component according to a second embodiment of the present invention.

Referring to FIG. 3, the composite electronic component 31 comprises a sintered body 30 has a hexahedral shape, and is provided therein with an inductor part 32 containing two inductors and a capacitor part 33 containing two capacitors respectively. Further, a first signal line electrode 35 and a dummy electrode 37 are formed on one of a pair of opposite side surfaces of the sintered body 30, while a second signal line electrode 36 and another dummy electrode 37 are formed on the other one of these side surfaces. A third signal line electrode 34 between the first and second signal line electrodes 35 and 36 is formed on one side surface of the sintered body 30. In addition, first and second ground electrodes 38 and 39 are formed on the remaining side surface.

Figure 4:
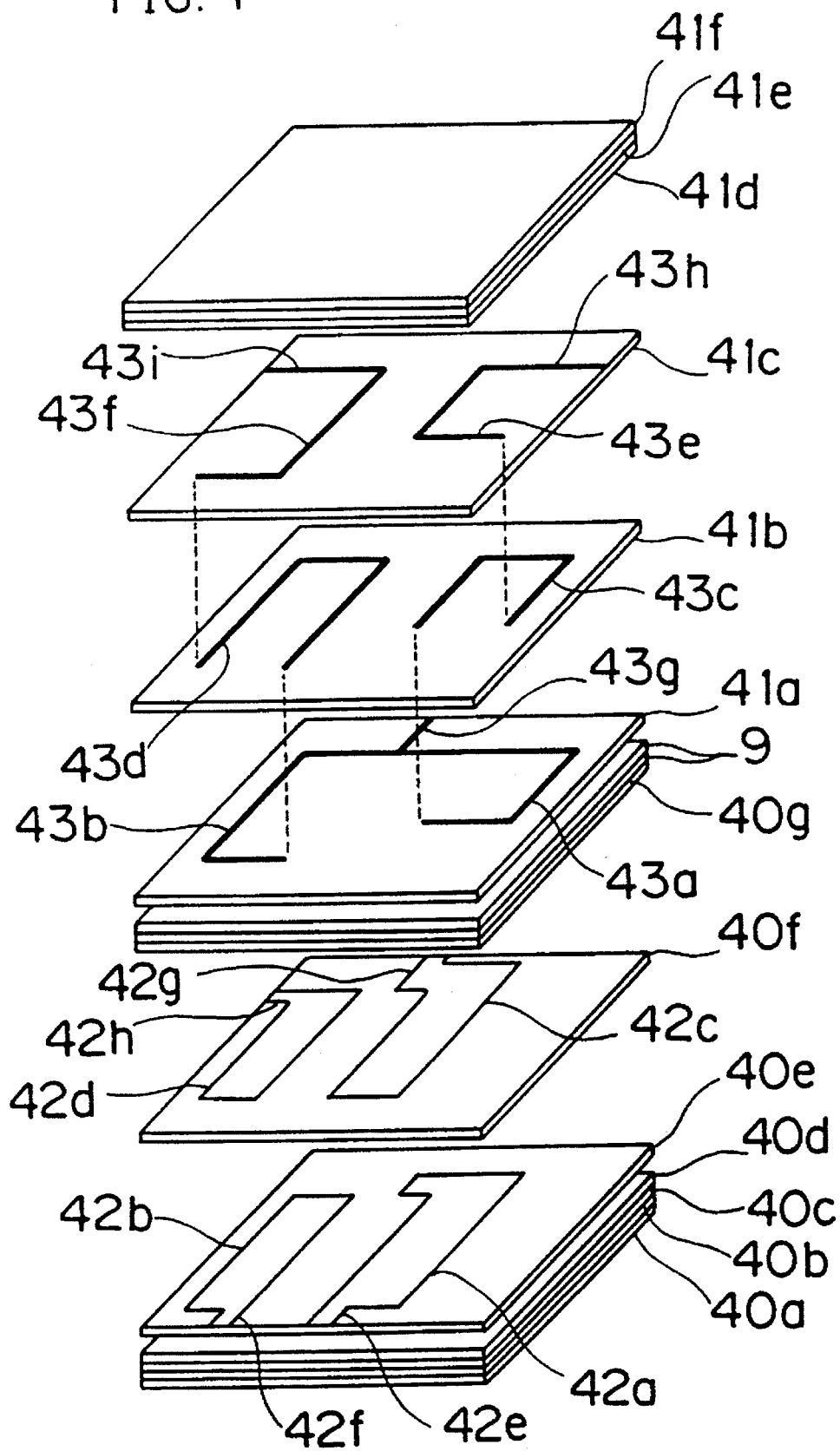
FIG. 4 is an exploded perspective view of the composite electronic component shown in FIG. 3 in a state before firing.

FIG. 4 is an exploded perspective view showing the composite electronic component 31 in a state before firing. The sintered body 30 is formed by integrally forming the capacitor part 32 consisting of capacitor green sheets 40a to 40g and the inductor part 33 consisting of inductor green sheets 41a to 41f with each other. The capacitor green sheets 40a to 40g and the inductor green sheets 41a to 41f are formed by a manufacturing method which is similar to that for the prior art shown in FIG. 13, except electrode shapes on the respective sheets.

Among the capacitor green sheets 40a to 40g forming the capacitor part 32, the capacitor green sheet 40e is provided with first capacitor electrodes 42a and 42b, while the capacitor green sheet 40f is provided with second capacitor electrodes 42c and 42d respectively. The capacitor electrodes 42a and 42b are opposed to the capacitor electrodes 42c and 42d respectively through the capacitor green sheet 40f. Further, the capacitor electrodes 42a to 42d are in series with external connection electrodes 42e to 42h respectively. The external connection electrodes 42e to 42h are exposed in any ones of three side surfaces of the capacitor green sheets 40e and 40f respectively. Thus, the capacitor part 33 has two capacitors which are independent of each other.

Among the inductor green sheets 41a to 41f forming the inductor part 33, on the other hand, the inductor green sheets 41a to 41c are provided with inductor electrodes 43a to 43f and external connection electrode parts 43g to 43i, which are derived toward three side surfaces of the inductor sheets 41a and 41c. First ends of the inductor electrodes 43a and 43b are electrically connected with each other to be integrally connected to the connection electrode part 43g. The inductor green sheet 41b is provided with through holes (not shown) which are positioned on first ends of the inductor electrodes 43c and 43d, so that the inductor electrodes 43c and 43d are electrically connected to second ends of the inductor electrodes 43a and 43b through these through holes respectively. The inductor green sheet 41c is provided with through holes (not shown) which are positioned on first ends of the inductor electrodes 43e and 43f respectively. The inductor electrodes 43e and 43f are electrically connected with second ends of the inductor electrodes 43c and 43d via these through holes respectively.

Second ends of the inductor electrodes 43e and 43f are connected to first ends of the connection electrode parts 43h and 43i respectively. The inductor part 32 which is formed by integrating the inductor green sheets 43a to 43f with each other has two inductors in which inductor electrodes 43a, 43c and 43e and 43b, 43d and 43f are electrically connected with each other via the respective through holes, and these two inductors are connected in series with each other.

Intermediate layers 9 consisting of green sheets which are prepared by mixing the inductor and capacitor materials with each other and molding the same are provided between the capacitor green sheet 40g and the inductor green sheet 41a, in order to attain an excellent adhering state after firing.

The aforementioned sheets 40a to 40g, 41a to 41f and 9 are stacked in the order shown in FIG. 4 and thereafter fired, to obtain the sintered body 30. The following electrodes are formed on outer portions of this sintered body 30, thereby obtaining the composite electronic component 31.

As shown in FIG. 3, the third signal line electrode 34 is formed on one side surface of the sintered body 30 at least to reach the lower surface, and electrically connected to the connection electrode 43g provided on one of the two inductors and the connection electrode part 42g of one of the capacitors. The first and second signal line electrodes 35 and 36 are formed on the opposite side surfaces of the sintered body 30 at least to reach the lower surface thereof. The first signal line electrode 35 is electrically connected to the connection electrode part 43h provided on the second end of the first inductor, while the second signal line electrode 36 is electrically connected to the connection electrode part 43i provided on the second end of the second inductor and the connection electrode part 43h of the second capacitor.

Further, the ground electrodes 38 and 39 are formed on an end surface of the capacitor part 33 located on the remaining side surface of the sintered body 30, to be electrically connected to the connection electrode parts 42e and 42f which are in series with the first ends of the first capacitor electrodes 42a to 42d forming the capacitors.

The dummy electrodes 37, which are provided on the opposite side surfaces of the sintered body 30 at least to reach the lower surface thereof and not electrically connected to all of the connection electrode parts 42e to 42h and 43g to 43i provided in the sintered body 30, are adapted to balance soldering strength etc. in correspondence to the first to third signal line electrodes 34 to 36 and the ground electrodes 38 and 39 at need when the composite electronic component 31 is soldered to a circuit board.

In the composite electronic component 31 having the aforementioned structure, the signal line electrodes 34 to 36 and the ground electrodes 38 and 39 are formed to extend to a face perpendicular to the stacked face, while the ground electrodes 38 and 39 are formed not to reach the surface of the inductor part 32.

Figure 5:
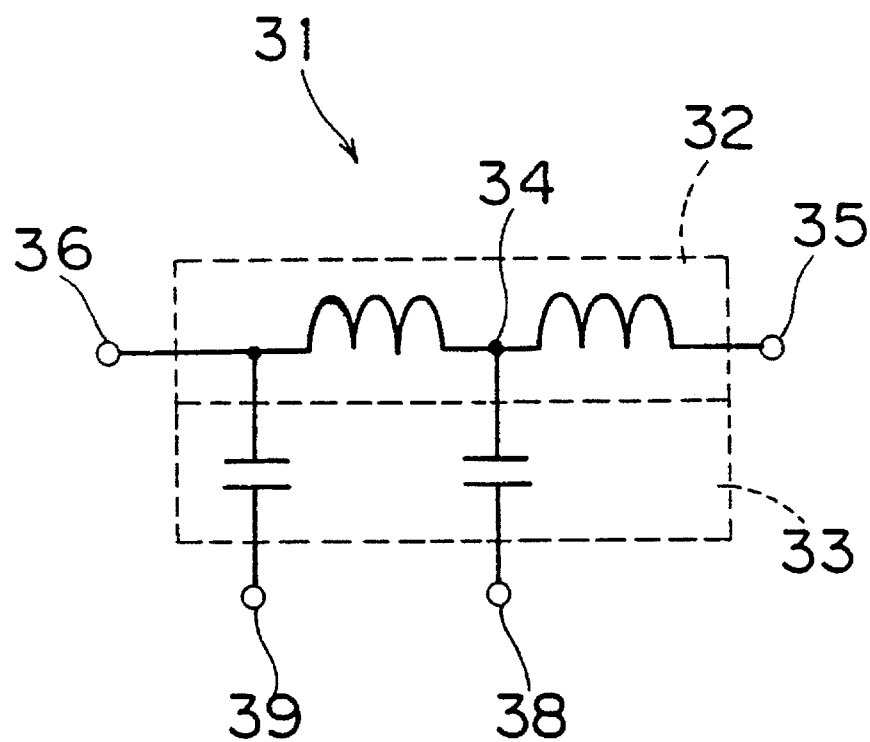
FIG. 5 is an equivalent circuit diagram of the composite electronic component shown in FIG. 3.

As shown in FIG. 5, an equivalent circuit of the aforementioned composite electronic component 31 is in the form of such an LC composite circuit that first ends of two inductors are connected in series with each other so that an end of one capacitor is connected to the junction therebetween and an end of another capacitor is connected to another end of one of the inductors.

The present invention is not restricted to the aforementioned circuit structure of the second embodiment, but various combinations of circuit structures are available for the capacitors formed in the capacitor part and the inductors formed in the inductor part. While the signal line electrodes and the ground electrodes are formed on the side surfaces of the sintered body in accordance with the aforementioned circuit structure, arrangement modes thereof are not restricted to those of the embodiment, so far as the ground electrodes remain on an end surface portion of the capacitor part.

A third embodiment of the present invention is now described with reference to FIG. 6.

Figure 6:
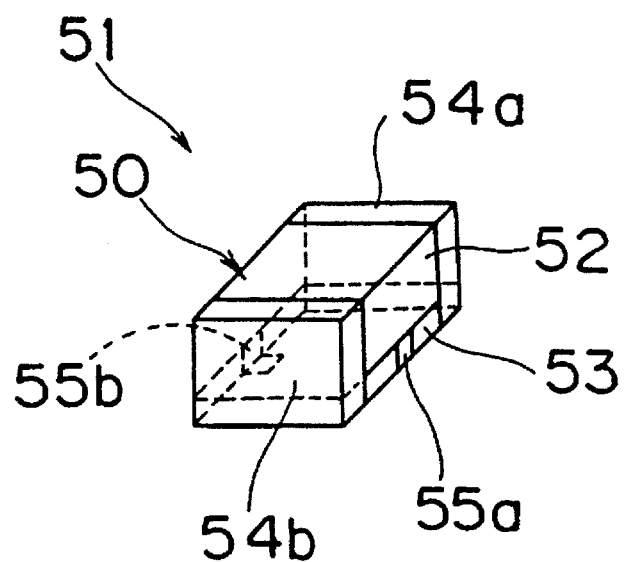
FIG. 6 is a perspective view showing a composite electronic component according to a third embodiment of the present invention.

Referring to FIG. 6, a composite electronic component 51 comprises an inductor part 52 which is formed on an upper section of a laminate and a capacitor part 53 which is formed on a lower section of the laminate. Signal line electrodes 54a and 54b are formed on a pair of outer end surfaces of the composite electronic component 51 to reach outer surfaces of the inductor part 52 and the capacitor part 53, while ground electrodes 55a and 55b are formed on another pair of opposite end surfaces of the sintered body which are different from those provided with the signal line electrodes 54a and 54b, in a portion forming the capacitor part 53. The ground electrodes 55a and 55b, which may partially reach the lower surface of the capacitor part 53, will not extend toward the overall lower surface.

Figure 7:
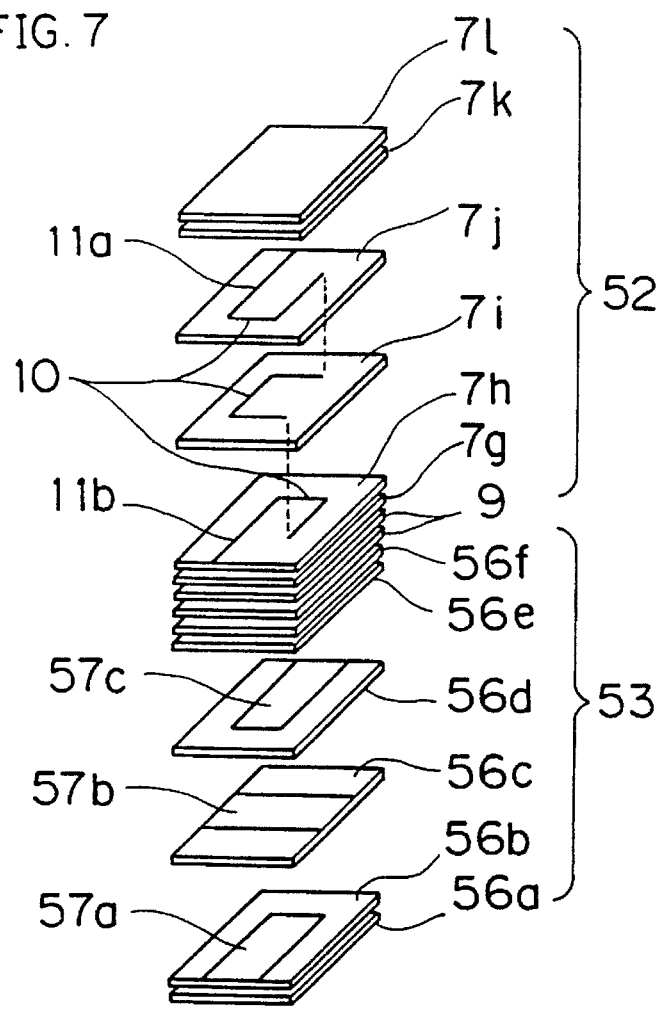
FIG. 7 is an exploded perspective view of the composite electronic component shown in FIG. 6 in a state before firing.

FIG. 7 is an exploded perspective view showing the composite electronic component 51 in a state before firing. The composite electronic component 51 comprises a sintered body 50 which is integrally provided therein with the inductor part 52 consisting of inductor green sheets 7g to 7l and the capacitor part 52 consisting of capacitor green sheets 56a to 56f respectively.

The inductor green sheets 7g to 7l forming the inductor part 52 are similar to those of the aforementioned prior art.

The capacitor part 53 is obtained by forming capacitor electrodes on surfaces of the capacitor green sheets 56a to 56f which are prepared by cutting a sheet of ceramic having a high dielectric constant similarly to the capacitor green sheets 8a to 8f forming the aforementioned prior art and stacking the green sheets 56a to 56f with each other.

The capacitor green sheets 56b to 56d are provided with capacitor electrodes 57a, 57b and 57c which are opposed to each other through the capacitor green sheets 56c and 56d. The capacitor electrodes 57a and 57c are alternately drawn out toward both end surfaces of the capacitor green sheets 56b and 56d corresponding to positions provided with connection electrode parts 11b and 11a of inductor electrodes 10. On the other hand, the capacitor electrode 57b is drawn out onto both end surfaces of the capacitor green sheet 56c which are different from those drawing out the connection electrode parts 11a and 11b. In the capacitor part 53, therefore, the capacitor electrodes 57a, 57b and the capacitor electrodes 57c, 57b overlapping respectively with each other through the capacitor green sheets 56c and 56d form two capacitors.

Intermediate layers 9 consisting of mixed green sheets which are prepared by mixing the inductor and capacitor materials with each other and molding the same are provided between the inductor green sheet 7g and the capacitor green sheet 56f, in order to attain an excellent adhering state after firing.

The green sheets 7g to 7l, 56a to 56f and 9 are stacked in the order shown in FIG. 7, compression-bonded and thereafter fired, to obtain the sintered body 50 which consists of sections forming the inductor part 52 and the capacitor part 53 respectively. The following electrodes are formed on outer parts of the sintered body 50, to obtain the composite electronic component 51.

Referring again to FIG. 6, the signal line electrodes 54a and 54b are formed on both side surfaces of the sintered body 50 deriving the connection electrode parts 11a and 11b of the inductor part 52 respectively. These signal line electrodes 54a and 54b are formed entirely over both end surfaces of the sintered body 50, for example, to be electrically connected with both ends of inductor electrodes of the inductor part 52, i.e., the connecting electrode parts 11a and 11b, and first ends of two capacitor electrodes of the capacitor part 53, i.e., the second capacitor electrodes 57c and 57a respectively. Further, the ground electrodes 55a and 55b are formed on a pair of opposite end surfaces of the portion forming the capacitor part 53, which are different from those provided with the signal line electrodes 54a and 54b, or on these end surfaces to partially reach the lower surface of the capacitor part 53. The ground electrodes 55a and 55b, which are not formed on the overall lower surface of the section of the capacitor part 53, are separated from each other. These ground electrodes 55a and 55b are electrically connected with the first capacitor electrode 57b of the capacitor part 53.

Therefore, the signal line electrodes 54a and 54b are formed on a pair of opposing surfaces which are perpendicular to stacked surfaces of the inductor green sheets 7g to 7l and the capacitor green sheets 56a to 56f, while the ground electrodes 55a and 55b will not reach surfaces of the inductor part 52.

Figure 8:
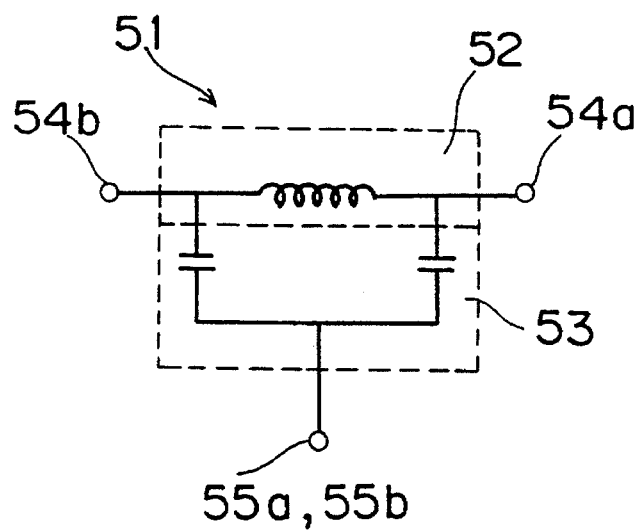
FIG. 8 is an equivalent circuit diagram of the composite electronic component shown in FIG. 6.

FIG. 8 shows an equivalent circuit of the aforementioned composite electronic component 51. The signal line electrodes 54a and 54b which are formed on both end surfaces of the inductor part 52, first and second end portions 11a and 11b of the inductor electrodes and the capacitor electrodes 57c and 57a of the capacitor part 53 are electrically connected with each other, while the first capacitor electrodes 57b of the capacitor part 53 is electrically connected with the ground electrodes 55a and 55b.

A composite electronic component 61 according to a fourth embodiment of the present invention is now described with reference to FIG. 9.

Figure 9:
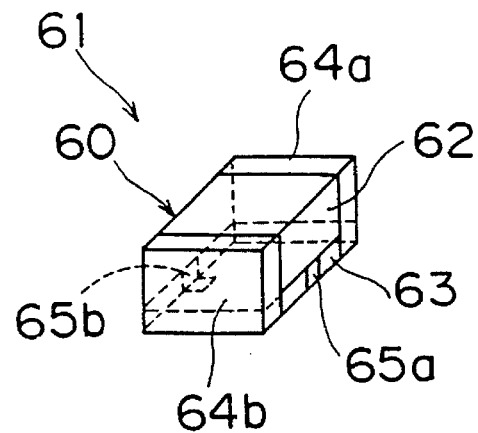
FIG. 9 is a perspective view showing a composite electronic component according to a fourth embodiment of the present invention.

Referring to FIG. 9, the composite electronic component 61 comprises an inductor part 62 and a capacitor part 63 which are formed on upper and lower sections of a sintered body 60 respectively. Signal line electrodes 64a and 64b are formed on a pair of opposite side surfaces of the composite electronic component 61 to extend over the sections of the inductor part 62 and the capacitor part 63 respectively. Ground electrodes 65a and 65b are formed on a pair of opposite end surfaces of the section forming the capacitor part 63, which are different from those provided with the signal line electrodes 64a and 64b. The ground electrodes 65a and 65b may not entirely but partially reach a lower surface of the section of the capacitor part 63.

Figure 10:
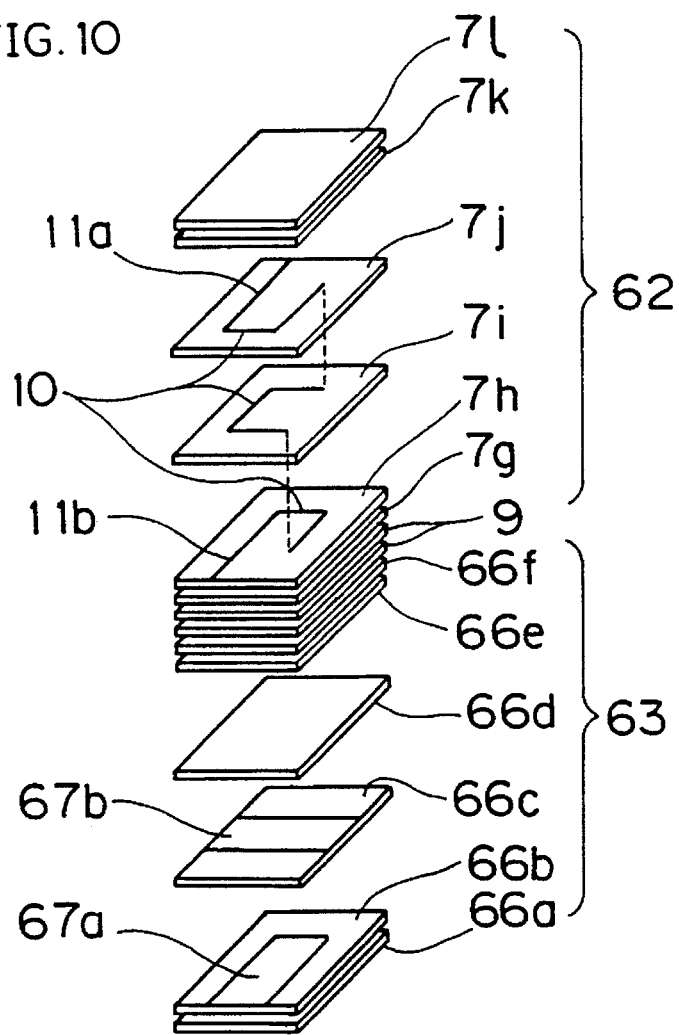
FIG. 10 is an exploded perspective view of the composite electronic component shown in FIG. 9 in a state before firing.

FIG. 10 is an exploded perspective view showing the composite electronic component 61 in a state before firing. In the composite electronic component 61, the inductor part 62 consisting of inductor green sheets 7g to 7l and the capacitor part 63 consisting of capacitor green sheets 66a to 66f are integrally provided with each other.

The inductor green sheets 7g to 7l forming the inductor part 62 are similar to those of the aforementioned prior art.

The capacitor part 63 is similar to the capacitor part 53 of the third embodiment, except that the same is provided with no capacitor electrode corresponding to the capacitor electrode 57a or 57c (the structure shown in FIG. 10 is provided with no capacitor electrode corresponding to the capacitor electrode 57c shown in FIG. 7). In the capacitor part 63, therefore, capacitor electrodes 67a and 67b which are opposed to each other through the capacitor green sheet 66c form one capacitor.

The green sheets 7g to 7l and 66a to 66f are stacked in the order shown in FIG. 10, compression-bonded and thereafter fired to obtain the sintered body 60 consisting of sections forming the inductor part 62 and the capacitor part 63 respectively. Signal line electrodes 64a and 64b and ground electrodes 65a and 65b are formed on outer parts of the sintered body 60 similarly to the third embodiment, thereby obtaining the composite electronic component 61.

Referring again to FIG. 9, the signal line electrodes 64a and 64b are formed to entirely cover both end surfaces of the sintered body 60, for example, and electrically connected with both ends (connection electrode parts 11a and 11b) of inductor electrodes of the inductor part 62 and a second capacitor electrode 67a of the capacitor part 63. Further, the ground electrodes 65a and 65b are formed on a pair of opposite end surfaces of the section forming the capacitor part 63, which are different from those provided with the signal line electrodes 64a and 64b, or on these end surfaces to partially reach the lower surface of the capacitor part 63. The ground electrodes 65a and 65b, which are not formed on the overall lower surface of the section of the capacitor part 63, are separated from each other. These ground electrodes 65a and 65b are electrically connected with the first capacitor electrode 67b of the capacitor part 63.

Therefore, the signal line electrodes 64a and 64b are formed on surfaces which are perpendicular to stacked surfaces of the inductor green sheets 7g to 7l and the capacitor green sheets 66a to 66f, while the ground electrodes 65a and 65b will not reach surfaces of the inductor part 62.

Figure 11:
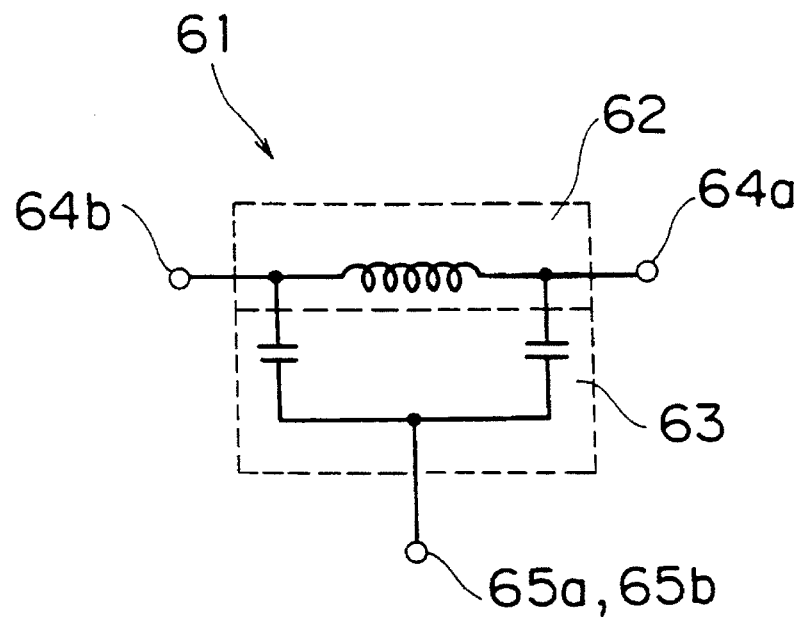
FIG. 11 is an equivalent circuit diagram of the composite electronic component shown in FIG. 9.
Figure 12:
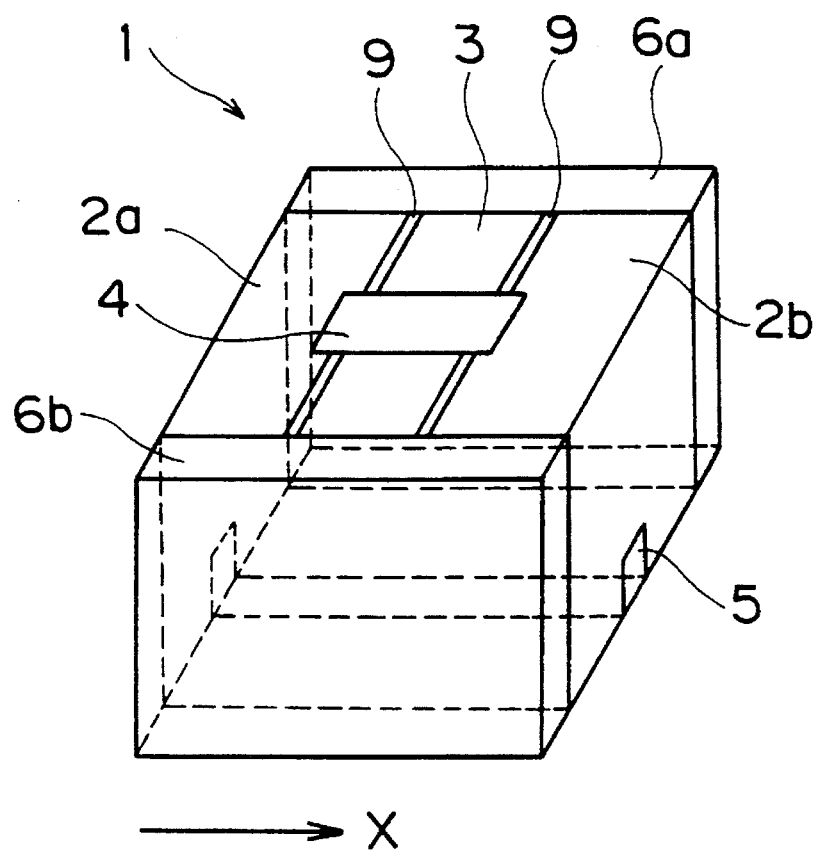
FIG. 12 is a perspective view showing a conventional T filter element.

FIG. 11 shows an equivalent circuit of the aforementioned composite electronic component 61. The signal line electrodes 64a and 64b which are formed on both end surfaces of the inductor part 62 and both ends (connection electrode parts 11a and 11b) of the inductor electrodes are electrically connected with each other, the signal line electrode 64a or 64b is electrically connected with the second capacitor electrode 67a of the capacitor part 63, and the first capacitor electrode 67b is electrically connected with the ground electrodes 65a and 65b respectively.

The inductor green sheets 7a to 7l which are employed for manufacturing the inventive composite electronic component are not restricted to a ferrite-based material, but may be prepared from a dielectric substance. In this case, the green sheets for forming the intermediate layers 9 may be omitted.

The numbers of the inductor and capacitor green sheets are not restricted to those in the aforementioned embodiments, but can be increased/reduced in response to desired characteristics.

The green sheets for forming the intermediate layers 9 are not restricted to mixed sheets prepared by mixing the inductor and capacitor materials. The inductor part(s) 2a, 2b, 52 or 62 and the capacitor part 3, 53 or 63 may be fired independently of each other to be bonded to each other with an epoxy-based adhesive, for example. Alternatively, the adhesive may be replaced by glass or the like for fusion-bonding the inductor part(s) and the capacitor part with each other.

Figure 15:
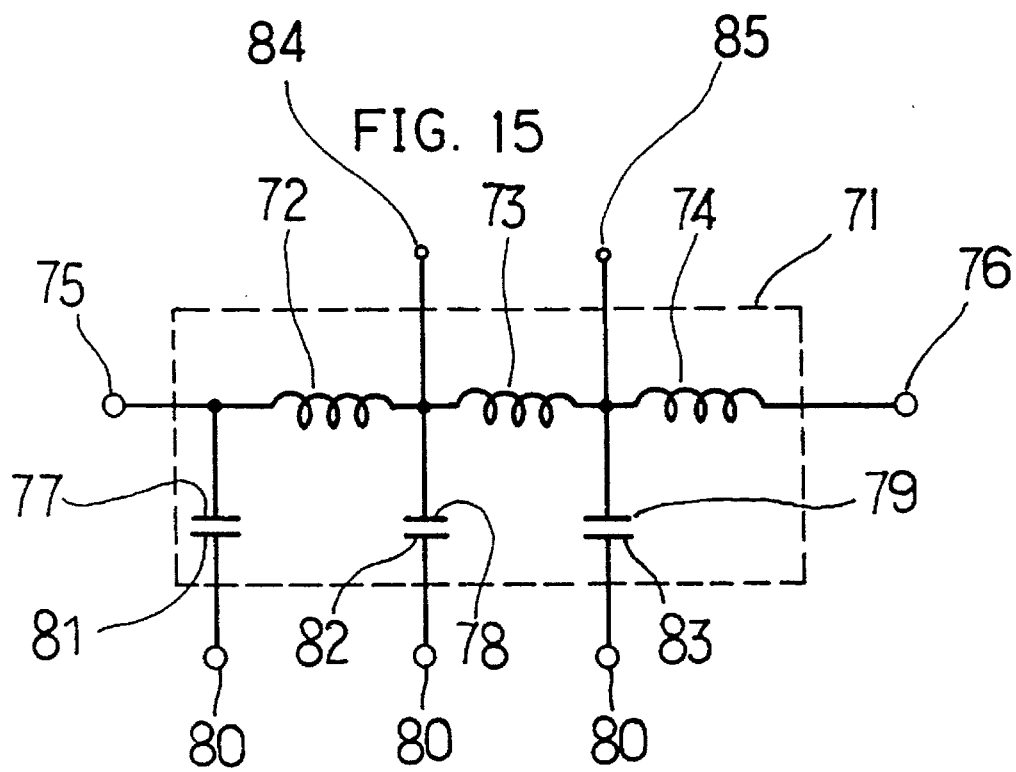
FIG. 15 is an equivalent circuit diagram of an alternative example of the composite electronic component shown in FIG. 3.
Figure 16:
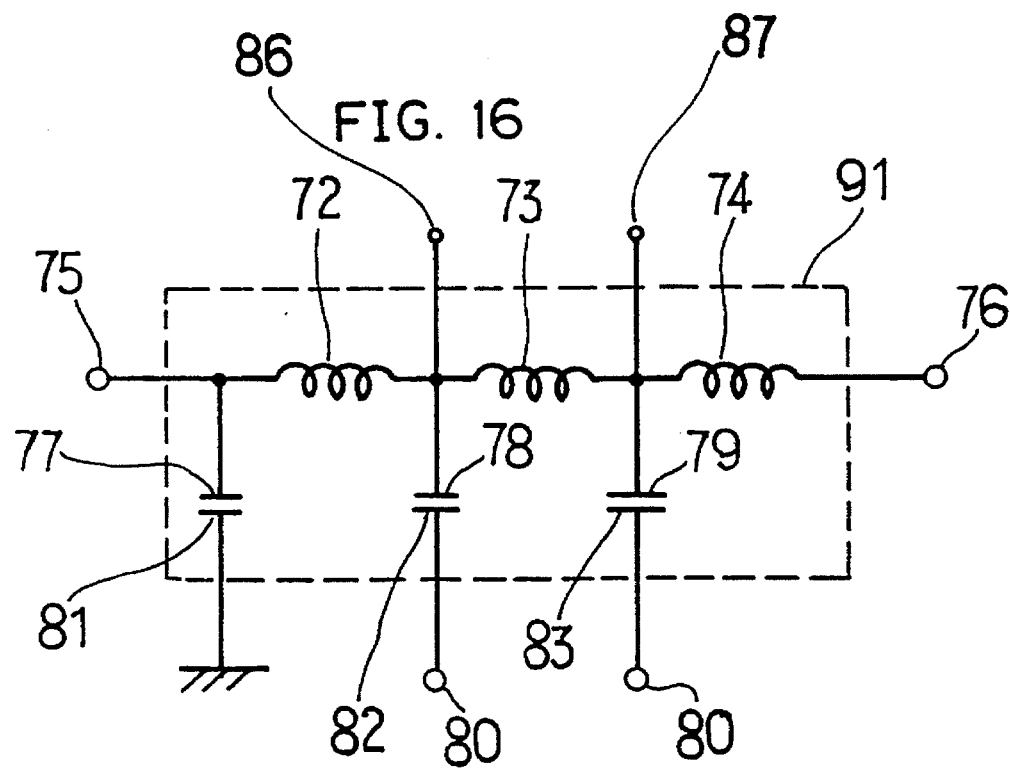
FIG. 16 is an equivalent circuit diagram of another alternative example of the composite electronic component shown in FIG. 3.

FIGS. 15 and 16 are equivalent circuit diagrams of alternative examples of the composite component shown in FIG. 3, respectively.

Particularly, with the embodiment shown in FIG. 3, two inductor parts and two capacitor parts are provided in the sintered body 30 as seen from the equivalent circuit diagram shown in FIG. 5. With the present invention, three or more inductor parts or three or more capacitor parts may be provided in a different region in a sintered body 71 as shown in FIG. 15. As shown in FIG. 15, inductor electrodes 72 to 74 are formed respectively in the inductor parts. In this case, signal line electrodes 75 and 76 are formed on opposite surfaces of the sintered body 71 as schematically shown in FIG. 15. The signal line electrodes 75 and 76 may be formed on at least one surface of the opposite surfaces of two sets of opposite surfaces of the sintered body.

Further, first end portions of the respective inductor electrodes 72 to 74 are directly or indirectly connected to one signal line electrode 75. Second capacitor electrodes 77 to 79 of three capacitor parts are directly or indirectly connected to the signal line electrode 75. First capacitor electrodes 81 to 83 are electrically connected to the signal line electrode 80.

Meanwhile, with the example shown in FIG. 16, three inductor parts and three capacitor parts are formed in a sintered body 91. Inductor electrodes 72 to 74 constituting the inductor parts respectively are connected to one signal-line electrode 75. Further, the other end of each inductor electrode 72 to 74 is directly or indirectly connected to the signal line electrode 76. These inductor electrodes are connected in series with each other. A capacitor electrode 81 of first capacitor electrodes 81 to 83 constituting the capacitor parts respectively is connected to the ground potential. The second capacitor electrodes 77 to 79 are directly or indirectly to the signal line electrode 75.

In also the structures shown in FIGS. 15 and 16, the electrode to be connected to the ground potential is so formed that the same does not extend to the outer surface of the inductor parts on the outer surface of the sintered body. Thus, hardly any stray capacitance between the inductor electrodes 72 to 74 and the ground electrode is generated.

In addition, the reference numerals 84 to 87 indicate signal line electrodes respectively and these electrodes 84 to 87 may be omitted or provided in the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite electronic component comprising:

a sintered body having first and second inductor parts and a capacitor part, said sintered body being a multilayer sintered body having a plurality of sintered body layers; and a ground electrode on an outer surface of said sintered body and electrically connected to said capacitor part, said around electrode not being formed on an outer surface of said first and second inductor parts, said capacitor part having first and second capacitor electrodes, wherein said sintered body is in the form of a hexahedron having three pairs of opposite surfaces, and said first and second inductor parts having inductor electrodes respectively and said capacitor part being held between said first and second inductor parts, and said composite electronic component further comprising first and second signal line electrodes being formed on one said pair of surfaces of said sintered body, first end portions of said inductor electrodes of said first and second inductor parts being electrically connected to said first and second signal line electrodes, while second end portions of said inductor electrodes of said first and second inductor parts being electrically connected with each other, said second capacitor electrode of said capacitor part being electrically connected to said second end portions of said inductor electrodes of said first and second inductor parts.

2. The composite electronic component in accordance with claim 1, wherein said first and second signal line electrodes comprise sputtered films.

3. The composite electronic component in accordance with claim 1, wherein each said signal line electrode is prepared from a film selected from the group consisting of an Ag film, a multilayer film consisting of an Ag layer and a monel layer, and a multilayer film consisting of an Ag layer, a monel layer and an Ni—Cr alloy layer.

4. The composite electronic component in accordance with claim 1, wherein said ground electrode extends in a direction substantially perpendicular to the stacking direction of said sintered body.

5. The composite electronic component in accordance with claim 4, wherein said ground electrode is formed on a part of said outer surface of said sintered body in a portion being provided with said capacitor part.

6. The composite electronic component in accordance with claim 1, wherein said first and second signal line electrodes are formed on one said pair of opposite surfaces being positioned on both sides of said first and second inductor parts and said capacitor part along the stacking direction.

7. The composite electronic component in accordance with claim 6, wherein said ground electrode extends in a direction substantially perpendicular to the stacking direction of said sintered body.

8. The composite electronic component in accordance with claim 7, wherein said ground electrode is formed on a part of said outer surface of said sintered body in a portion being provided with said capacitor part.

* * * * *